United States Patent [19]

Arseneau et al.

[11] Patent Number: 4,786,859
[45] Date of Patent: Nov. 22, 1988

[54] RMS MEASURING APPARATUS FOR AC/DC VOLTAGES

[75] Inventors: Rejean Arseneau, Orleans; John J. Zelle, Gloucester, both of Canada

[73] Assignee: Canadian Patents and Development Ltd., Ottawa, Canada

[21] Appl. No.: 55,553

[22] Filed: May 29, 1987

[30] Foreign Application Priority Data

Jun. 2, 1986 [CA] Canada .................. 510602

[51] Int. Cl.[4] .................. G01R 17/06; G01R 19/03
[52] U.S. Cl. ........................ 324/98; 324/106; 324/132
[58] Field of Search ............ 324/98, 99 D, 105, 106, 324/119, 132

[56] References Cited

U.S. PATENT DOCUMENTS

| | | | |
|---|---|---|---|
| 3,842,349 | 10/1974 | Cox et al. | 324/132 X |
| 3,845,388 | 10/1974 | Ley et al. | 324/132 X |
| 3,911,359 | 10/1975 | Metcalf | 324/132 X |
| 4,360,880 | 11/1982 | Brodie et al. | 324/132 X |
| 4,628,256 | 12/1986 | Powell | 324/106 X |

OTHER PUBLICATIONS

IEEE Trans. on Instrum. & Meas., Gerr et al., "Automating Wide-Band AC/DC Transfer Measurements", vol. IM 25, No. 4, Dec. 1976, pp. 533-537.
IEEE Trans. on Instrum. & Meas., Inglis, "AC-DC Transfer Standards-Present Status and Future Directions", vol. IM 34, No. 2, Jun. 1985, pp. 285-289.

Primary Examiner—Reinhard J. Eisenzopf
Assistant Examiner—Stephen M. Baker
Attorney, Agent, or Firm—Yoshiharu Toyooka

[57] ABSTRACT

A true RMS instrument using a multijunction thermal converter with two beaters automatically determines and displays the RMS value of an unknown voltage using two steps or modes. In an AC mode, the unknown voltage is attenuated and balanced in the thermal converter with a DC voltage. DC voltage is stored in digital form in a first latch. In the DC mode, the unknown attenuated voltage is replaced by a chopped DC voltage which is then balanced with the DC voltage obtained in the AC mode. The unknown voltage is determined by decoding the contents of a second lath which controls the chopped DC voltage.

7 Claims, 2 Drawing Sheets

RMS MEASURING APPARATUS FOR AC/DC VOLTAGES

THE FIELD OF THE INVENTION

The present invention relates to the measurement of an AC or DC voltage and in particular to the accurate measurement of a true RMS (root-means-square) value of an input signal by the use of a MJTC (multijunction thermal converter).

BACKGROUND OF THE INVENTION

The most widely used precision AC measurment makes use of the AC/DC transfer method. The principle is based on measuring some reliable and convertible characteristic such as the RMS of an AC signal under known and controlled conditions and then producing a measurement of equal magnitude by application of pure DC voltage and precisely measuring the DC. The device used for converting an AC signal to a DC signal under known and controlled conditions is a differential multijunction thermal converter (MJTC). The article "Differential multijunction thermal converter" by A. J. Wilkins et al, Proceedings of IEE Vol. 112, No. 4, p. 794, April 1965 provides a detailed description of the thermal converter. U.S. Pat. No. 3,842,349 Oct. 15, 1974, (Cox et al) describes an AC/DC RMS comparator. Briefly speaking, in the instrument of Cox et al, an unknown AC voltage and a reference DC voltage are alternately applied to one side of a MJTC by using electronic switches. A feedback circuit with an integrator applies a nulling voltage to the other side of the converter. The output of the integrator is connected to one Sample/Hold circuit when the unknown AC voltage is applied to the converter and to another Sample/Hold circuit when the reference DC voltage is applied to the converter. If the unknown AC voltage and the reference DC voltage have the same RMS value, Sample/Hold circuits are in balance. The value of the unknown AC voltage is obtained by measuring the voltage of the DC reference.

Although this instrument is said to be automatic, it requires 4 manual operations to achieve a high accuracy measurement. These operations are reversal of the DC reference, i.e., DC+ and DC−, and interchange of the input channels, i.e., Normal and Reverse. Thus to determine the value of the unknown AC voltage 4 manually controlled measurements are necessary.

U.S. Pat. No. 3,845,388 Oct. 29, 1974 (Ley et al) discloses an RMS converter wherein a voltage-to-frequency converter is used in a feedback circuit which operates in the digital fashion. However this instrument is called single-ended in that only an unknown input AC signal is put through a MJTC and a converter output is compared with a DC reference. As mentioned above, in the device of Cox et al, an unknown AC signal and a DC reference are alternatively applied to the same heater of the MJTC and the difference in the converter outputs is used to determine the RMS value of the AC signal.

An automated AC-DC difference calibration system is described in the article "A dual-channel automated comparator for AC-DC difference measurements" by Williams et al in IEEE Trans. on Instrumentation and Measurement, Vol. IM-34 No. 2, June 1985 pp. 290–294. The comparator consists essentially of two practically identical channels, each containing a thermal voltage converter. All AC and DC signals are simultaneously applied to the channels and the difference between them is measured and displayed. Though fast in operation, the system requires extensive instrumentation.

SUMMARY OF THE INVENTION

Briefly stated, the present invention is directed to an apparatus for automatically measuring the true RMS value of an input signal, comprising:
- a thermal converter means having a first heater, a second heater, and a converter output terminal;
- an attenuator means for receiving the input signal and producing an attenuated input signal;
- an electronic switch means connected between the attenuator means and the first heater;
- an integrating means connected to the output terminal for amplifying and integrating a converter output signal from the output terminal;
- a counter means connected to the integrating means for producing a counter output in response to the converter output signal;
- a first latch means connected between the counter means and the second heater for applying a first latch output to the second heater in response to the counter output;
- a second latch means connected to the counter means for producing, in response to the converter output, a second latch output;
- a chopper means connected between the second latch means and the electronic switch means for applying a chopper output to the electronic switch means in response to the second latch output; and
- a display means connected to the counter means, in that
- the said electronic switch means alternately applies the attenuated input signal and the chopper output to the first heater;
- the first latch means latches the first latch output when the converter output signal indicates that the attenuated input signal and the first latch output are balanced;
- the second latch means latches the second latch output when the converter output signal indicates that the chopper output and the first latch output are balanced; and
- the display means displays the counter output which is indicative of the true RMS value of the input signal when the second latch means is latched.

BRIEF DESCRIPTION OF THE DRAWINGS

The invention will be readily understood from the following detailed description, taken in conjunction with the accompanying drawings, in which.

DETAILED DESCRIPTION OF THE PREFERRED EMBODIMENT

Figure 1:
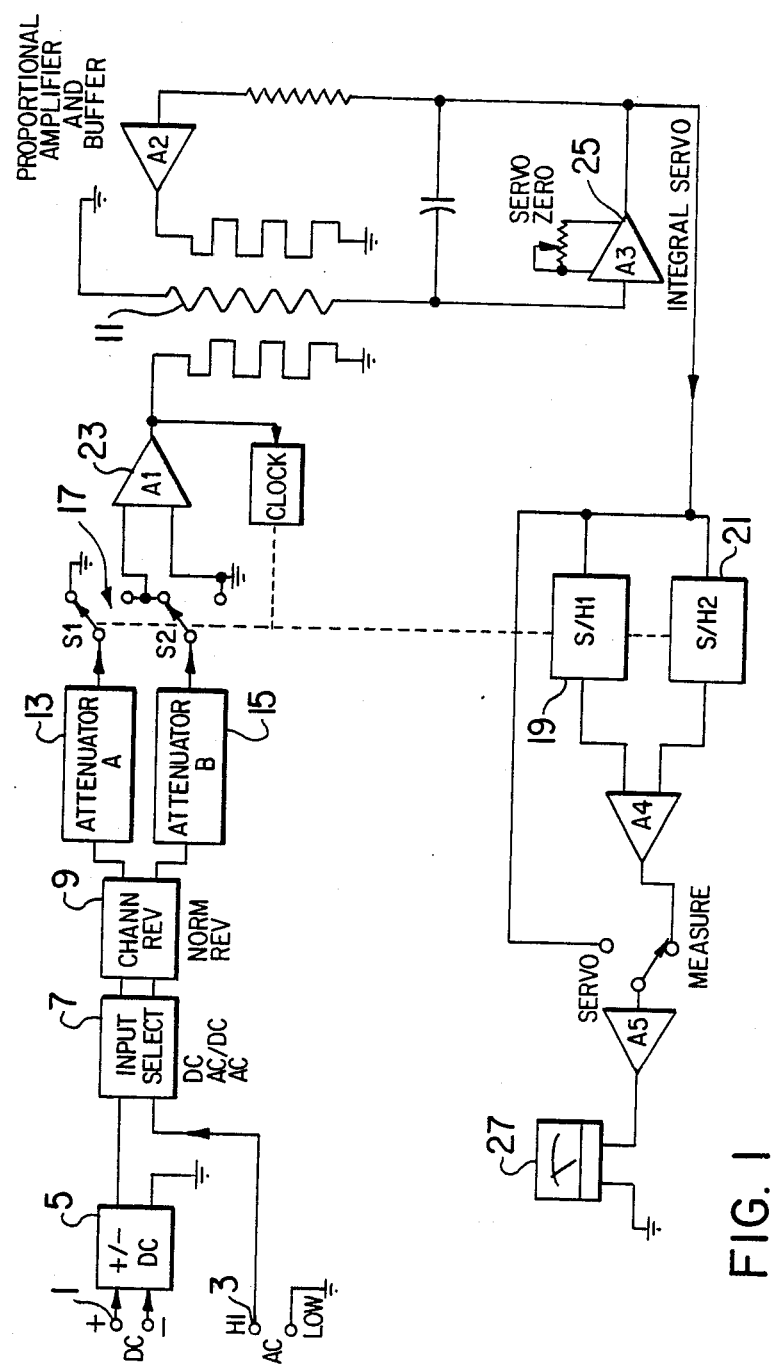
FIG. 1 is a schematic diagram of the AC RMS measurement system according to the prior art.

While full descriptions of the prior art are found in the patents and articles referred to above, it is felt helpful for the understanding of the present invention to study a little more closely the most widely used AC measurement system such as that of Cox et al. FIG. 1 shows a schematic diagram of such a system. A DC standard voltage and an unknown AC voltage are to be applied to DC terminal 1 and AC terminal 3 respectively. Switches 5, 7, and 9 are provided to enable various combinations of the DC standard voltage and the unknown AC voltage to be applied to the first of the two heaters in the MJTC 11. These interchanges of the voltages ensure proper balancing of two channels including two distinct attenuators 13 and 15. An FET switch 17 facilitates a quick alternate application of the DC and AC to the first heater. Sample and hold circuits 19 and 21 are synchronized with the FET switch 17. In operation, first, the FET switch connects the DC signal to the heater one by way of an amplifier 23 and at the same time the AC signal is grounded through the attenuator 15. The sample and hold circuit 19 samples the filtered output voltage from integrator amplifier of an integral servo-circuit 25 and this voltage is stored as an output therefrom. The switch 17 then grounds the attenuator 13 and connects the AC signal to the heater through the amplifier 23. The RMS value of the AC voltage is sampled and stored by the sample and hold circuit 21. The difference between the two values is amplified and displayed by a panel meter 27.

The MJTC is used as an RMS comparator when the known and unknown RMS are consecutively applied to heater one. A proportional part of the known RMS is applied to heater two with the integral servo-circuit 25 adding to this RMS, such that the output of the MJTC is zero. The difference in the servo-circuit output when the known RMS are applied to the heater one represents the difference between the known and unknown RMS.

The invention will now be described in more detail, by way of an example only, with reference to FIG. 2 of the accompanying drawings which is a block diagram of one embodiment of the present invention.

In the figure, a MJTC is shown at 31 and has a first and a second heaters designated by H1 and H2 and a converter output terminal 32. An electronic switch 33, which could be of the FET type shown in the patent to Cox et al, is connected to the first heater H1 and applies thereto alternately an attenuated input signal and a chopper output. A set of input attenuators are provided at 35 for various ranges of an unknown input signal supplied thereto at 37, e.g. 2, 12, 60 and 120 volts. The input attenuators and a precision chopper 34 (in this embodiment operating at 85 Hz) produce the attenuated input signal and the chopper output respectively. An integrating means is connected to the converter output terminal 32 and may consist of a chopper stabilized pre-amplifier 39, an amplifier 41, an integrator 43, an absolute value circuit 45 and a voltage-to-frequency converter 47. A counter 49 is connected to the output of the voltage-to-frequency converter 47 and produces a counter output in response to the converter output signal from the converter output terminal 32 after the latter having been processed by the integrating means. In the present embodiment, the counter output is of a digital in nature, in the form of 20 bits. A first and a second latches 51 and 53 are connected to the counter 49 to receive the digital counter output. Each latch is provided with a digital-to-analog converter which transforms the digital counter output to a latch output of an analog form. The first latch 51 is connected to the second heater H2 through a digital-to-analog converter 55 to apply a first latch output to the second heater. The second latch 53 is connected to the precision chopper 34 through a digital-to-analog converter 57 to supply a second latch output thereto.

An internal precision DC reference is provided at 59 and calibrates the both latches 51 and 53 by way of the digital-to-analog converters 55 and 57. Decoding and display 61 is connected to the counter 49 to decode the digital counter output and to display its value in a direct-reading fashion.

The embodiments may further include a preseting mechanism which consists of a RMS-to-digital converter 63 of a conventional type and an error monitor circuit 65. The error monitor circuit 65 is connected to the chopper-stabilized preamplifier 39 and produces a preset enable signal which enables the counter 49 to receive an 8-bit output signal from the RMS-to-digital converter 63. The RMS-to-digital converter 63 is supplied with the attenuated input signal from the attenuators 35.

Figure 2:
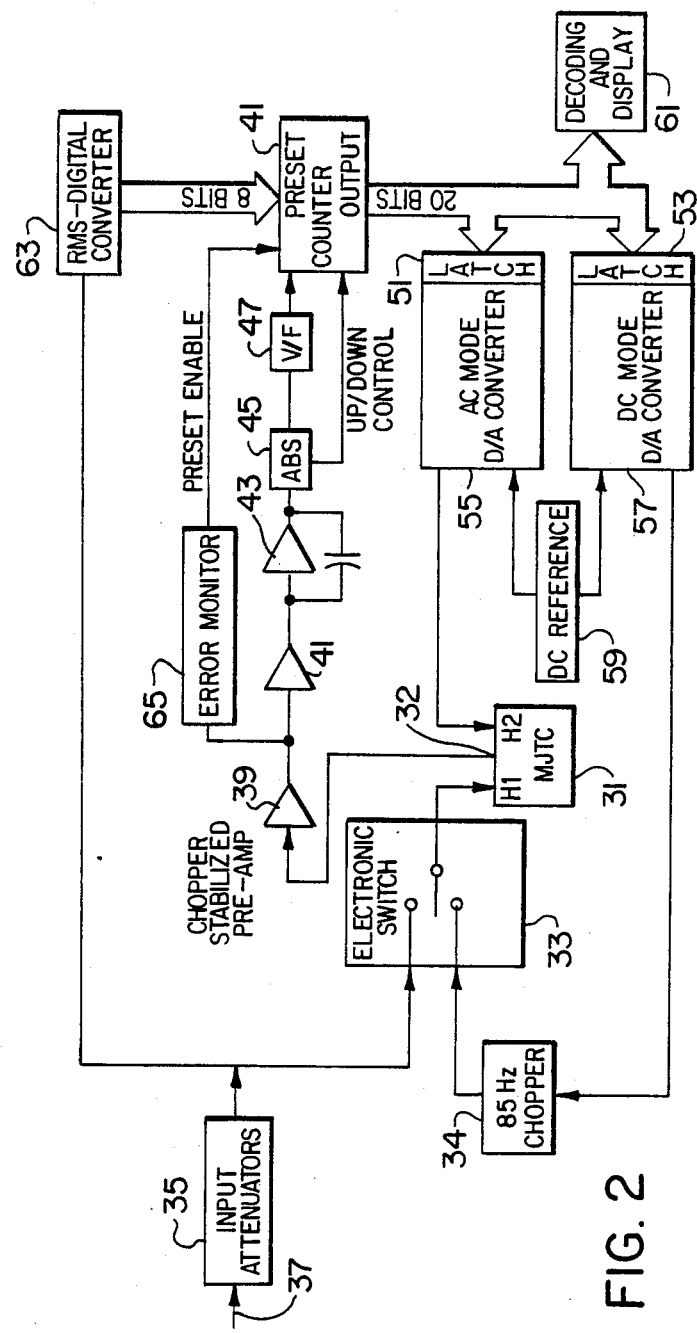
FIG. 2 is a block diagram of the measurement instrument according to the present invention.

The operation of the instrument shown in FIG. 2 is now described.

The value of the unknown AC or DC voltage is determined in two steps or modes, the AC mode and the DC mode. The time needed to complete each mode is approximately 5 seconds.

An unknown AC or DC voltage is applied to the input attenuators 35 at the terminal 37 and at the start of the first AC mode, the counter 49 is initially preset from the value determined by the RMS-to-digital converter 63. The preset function is enabled when the error signal in the feedback loop is larger than 1%. The counter output of the counter 49 is used to increment the first latch 51 and the digital-to-analog converter 55. The resulting first latch output, a DC voltage representing the unknown voltage, is fed to heater H2. At the same time the unknown attenuated voltage is connected to heater H1 through the electronic switch 33. The output at the terminal 32 of the MJTC 31 following pre-amplification by a chopper stabilized pre-amplifier 39 is fed to amplification and integration stages 41 and 43 respectively. The output of the integrator 43 is sent to an absolute value circuit 45 and then to a voltage-to-frequency converter 47 which closes the feedback loop at the counter 49. The direction of the counter is controlled by a logic circuit in the absolute value circuit 45. The new counter output is used to update the first latch 51 and the digital-to-analog converter 55. The feedback loop is designed to have a high DC gain and sufficient low frequency roll-off to minimize the effects of harmonic ripple present in the output of the MJTC. At the end of the AC mode, the first latch 51 is latched in place and the value of the counter is stored at the first latch 51 when the converter output from the terminal 32, after having been processed, indicates the first latch output and the unknown attenuated voltage are balanced. This value is needed to preset the counter at start of the next AC mode.

At the start of the DC mode, the output of the counter is used to increment the second latch 53 and the digital-to analog converter 57 and DC voltage is obtained. This DC voltage is chopped by the chopper 34 between the positive and negative polarities at a frequency of 85 Hz. This chopper output is sent to heater H1 and compared to the voltage at heater H2 which had nulled the unknown attenuated voltage in the AC mode. The output of the MJTC is again fed back through the counter 49 but now the second latch 53 and the digital-to-analog converter 57 are updated. At the end of the DC mode, the voltage from the converter 57 has nulled the voltage from the converter 55. The second latch is latched and the output of the counter is stored for the next DC mode operation. The unknown voltage can be determined by decoding the digital counter output to second latch 53. The instrument is switched to the AC mode to repeat the measurement cycle.

The present instrument eliminates the need to manually reverse the DC reference voltage by using a precision chopper, thereby eliminating the MJTC DC reversal difference. There is no need to reverse the input channel since there is only one set of attenuators. The instrument is direct reading and truly automatic. While it is possible to design the instrument operating in an analog mode according to the present inventive concept, the preferred embodiment employs a digital operation. The digital counter in the feedback loop permits the use of digital-to-analog converters to drive the heaters and also facilitates the implementation of the adjustable DC reference voltage by using an internal DC reference operating in conjunction with a digital-to-analog converter. Preliminary tests have shown that the accuracy of the instrument of the present invention will be within 50 ppm of input range at frequencies from 50 Hz to 50 KHz.

We claim:

1. An apparatus for automatically measuring the true RMS value of an input signal, comprising:
   a thermal converter means having a first heater, a second heater and a converter output terminal,
   an attenuator means for receiving the input signal and producing an attenuated input signal,
   an electronic switch means connected between the attenuator means and the first heater,
   an integrating means connected to the output terminal for amplifying and integrating a converter output signal from the converter output terminal,
   a counter means connected to the integrating means for producing a counter output in response to the converter output signal,
   a first latch means connected between the counter means and the second heater for applying a first latch output to the second heater in response to the counter output,
   a second latch means connected to the counter means for producing, in response to the counter output, a second latch output,
   a chopper means connected between the second latch means and the electronic switch means for applying a chopper output to the electronic switch means in response to the second latch output, and
   a display means connected to the counter means, in that:
   the said electronic switch means alternately applies the attenuated input signal and the chopper output to the first heater;
   the first latch means latches the first latch output when the converter output signal indicates that the attenuated input signal and the first latch output are balanced;
   the second latch means latches the second latch output when the converter output signal indicates that the chopper output and the first latch output are balanced; and
   the display means displays the counter output which is indicative of the true RMS value of the input signal when the second latch means is latched.

2. The apparatus according to claim 1 wherein the thermal converter is a differential multijunction thermal converter.

3. The apparatus according to claim 2, further comprising:
   a preset means connected between the attenuator means and the counter means for applying a preset signal, in response to the attenuated input signal, to the counter means, and
   an error monitor means connected between the integrating means and the counter means for producing a preset enable signal which enables the counter means.

4. The apparatus according to claim 3, further comprising a DC precision reference for calibrating the first and the second latch means.

5. The apparatus according to claim 4 wherein the integrating means includes a voltage-to-frequency converter, the first and the second latch means are each provided with a digital-to-analog converter, and the display means includes a decoding means for decoding the converter output.

6. The apparatus according to claim 5 wherein the attenuator means comprises a plurality of attenuators for different ranges of the input signal.

7. The apparatus according to claim 6 wherein the integrating means further comprises a chopper stabilized amplifier.

* * * * *